(12) United States Patent
Briancon et al.

(10) Patent No.: US 7,163,155 B2
(45) Date of Patent: Jan. 16, 2007

(54) ASIC-EMBEDDED SWITCHABLE ANTENNA ARRAYS

(75) Inventors: Alain Charles Louis Briancon, Poolesville, MD (US); Howard E. Goldberg, Wynnewood, PA (US)

(73) Assignee: InterDigital Technology Corporation, Wilmington, DE (US)

( * ) Notice: Subject to any disclaimer, the term of this patent is extended or adjusted under 35 U.S.C. 154(b) by 212 days.

(21) Appl. No.: 10/744,799

(22) Filed: Dec. 23, 2003

(65) Prior Publication Data

US 2005/0093145 A1 May 5, 2005

Related U.S. Application Data

(60) Provisional application No. 60/517,692, filed on Nov. 5, 2003.

(51) Int. Cl.
*G06K 19/06* (2006.01)

(52) U.S. Cl. .................. 235/492; 235/449; 235/486; 235/487

(58) Field of Classification Search ............ 235/492, 235/449, 486, 487
See application file for complete search history.

(56) References Cited

U.S. PATENT DOCUMENTS

| | | | | |
|---|---|---|---|---|
| 5,115,245 A * | 5/1992 | Wen et al. | ........... | 343/700 MS |
| 5,212,373 A * | 5/1993 | Fujioka et al. | ........... | 235/492 |
| 5,461,385 A * | 10/1995 | Armstrong | ........... | 342/42 |
| 5,773,880 A * | 6/1998 | Ohno | ........... | 257/679 |
| 5,818,385 A * | 10/1998 | Bartholomew | ........... | 342/372 |
| 6,096,576 A * | 8/2000 | Corbin et al. | ........... | 438/108 |
| 6,121,676 A * | 9/2000 | Solberg | ........... | 438/108 |
| 6,172,608 B1 * | 1/2001 | Cole | ........... | 343/719 |
| 6,194,993 B1 * | 2/2001 | Hayashi et al. | ........... | 235/492 |
| 6,225,688 B1 * | 5/2001 | Kim et al. | ........... | 257/686 |
| 6,356,535 B1 * | 3/2002 | Smith | ........... | 340/10.1 |
| 6,359,594 B1 * | 3/2002 | Junod | ........... | 343/744 |
| 6,378,774 B1 * | 4/2002 | Emori et al. | ........... | 235/492 |
| 6,388,313 B1 * | 5/2002 | Lee et al. | ........... | 257/686 |
| 6,422,473 B1 * | 7/2002 | Ikefuji et al. | ........... | 235/492 |
| 6,555,917 B1 * | 4/2003 | Heo | ........... | 257/777 |
| 6,700,542 B1 * | 3/2004 | Borlez et al. | ........... | 343/700 MS |
| 6,790,706 B1 * | 9/2004 | Jeung et al. | ........... | 438/113 |
| 6,864,848 B1 * | 3/2005 | Sievenpiper | ........... | 343/767 |
| 6,882,319 B1 * | 4/2005 | Jinushi | ........... | 343/702 |
| 2003/0180987 A1 * | 9/2003 | Milla et al. | ........... | 438/109 |

* cited by examiner

*Primary Examiner*—Uyen-Chau N. Le
(74) *Attorney, Agent, or Firm*—Volpe & Koenig, P.C.

(57) ABSTRACT

An antenna design of compact dimensions is provided by incorporating the antenna structure into an integrated circuit or small circuit module. A radiation pattern adjustment mechanism permits dynamic, real-time adjustment of the antenna pattern in response to motion, repositioning, handovers, or other changing conditions. Pursuant to one preferred embodiment of the invention, the antenna includes a plurality of substantially conductive elements embedded into or formed on the integrated circuit. At least one of the conductive elements is coupled to a radiation pattern adjustment mechanism in the form of a switching diode or relay. The antenna elements are arranged in a manner so as to provide parasitic interaction.

66 Claims, 6 Drawing Sheets

ASIC-EMBEDDED SWITCHABLE ANTENNA ARRAYS

CROSS REFERENCE TO RELATED APPLICATION(S)

This application claims priority from U.S. Provisional Application No. 60/517,692 filed on Nov. 5, 2003, which is incorporated by reference as if fully set forth.

FIELD OF THE INVENTION

The present invention relates generally to antennas and, more specifically, to antenna designs that are embedded within integrated circuits.

BACKGROUND

Handheld wireless communication devices of compact dimensions are often preferred, so as to provide users with a measure of convenience, portability, unobtrusiveness, and ease of maneuverability. In furtherance of these objectives, substantial efforts have been directed towards reducing the spatial volume occupied by semiconductor chips, resistors, capacitors, and circuit substrates. Nonetheless, the amount of space required for an antenna covering a specified frequency range has remained relatively constant. For many practical applications, antenna designs occupy an undesirably large area or volume.

An antenna is comprised of one or more elements, which for the purposes of this description can include any combination of active and parasitic radiators, reflectors and directors. Antenna elements also include loading devices and other components providing signal propagation capabilities for transmission and reception.

In addition to size, another shortcoming of existing antenna designs is that they are fixedly mounted to the handheld wireless communication device, yet no mechanism is provided for changing the radiation pattern of the antenna, such as in response to movement of the communication device. Accordingly, it is desirable to have an antenna of compact dimensions that includes a radiation pattern adjustment mechanism.

One area of growing interest for wireless communications is the use of variable input (VI) arrangements for tracking multiple signals, for example, those coming from different satellites. Typically, variable input communications are conducted using a plurality of receiving antenna elements. One drawback to widespread application is having multiple antenna elements in small receive only devices such as satellite radios, digital video or digital audio systems. It would be desirable to provide such multiple antenna elements in a small device.

SUMMARY

An antenna design of compact dimensions is provided by incorporating the antenna structure into an integrated circuit or small scale packaged circuit. A radiation pattern adjustment mechanism permits dynamic, real-time adjustment of the antenna pattern in response to motion, repositioning, handovers, or other changing conditions. Pursuant to one preferred embodiment of the invention, the antenna includes a plurality of substantially conductive elements embedded into or formed on the integrated circuit. At least one of the conductive elements is coupled to a radiation pattern adjustment mechanism in the form of a switching diode or relay. The antenna elements are arranged in a manner so as to provide parasitic interaction.

DETAILED DESCRIPTION OF THE PREFERRED EMBODIMENTS

Figure 1:
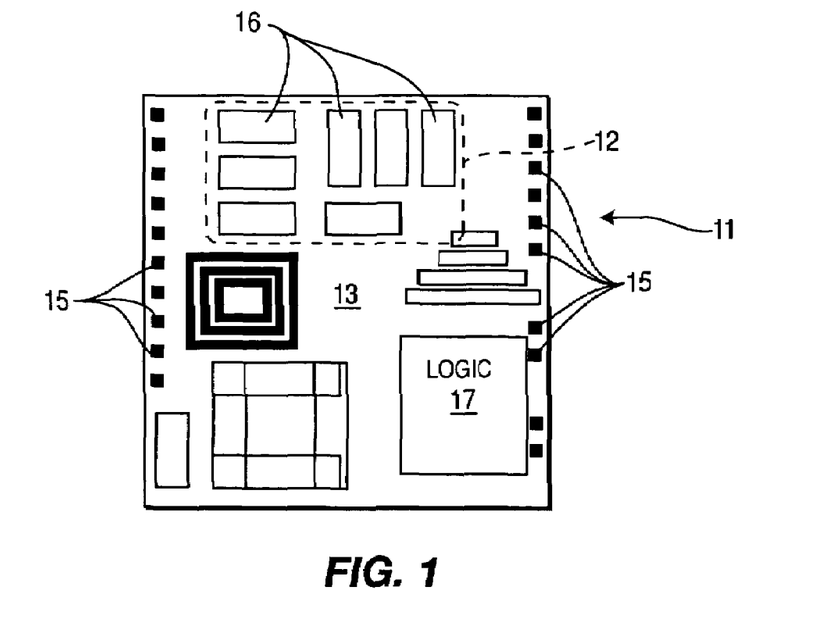
FIG. 1 is a diagrammatic representation of a semiconductor chip that includes an antenna farm.

FIG. 1 is a diagrammatic representation of a semiconductor chip assembly 11 that includes an antenna farm 12. The semiconductor chip assembly includes a first semiconductor chip comprising a substrate having a front surface 13, a rear surface (not shown in FIG. 1) with an interconnection substrate which includes conductive terminals or contact pads 15, also located on the front surface 13. The substrate of the first semiconductor chip contains a plurality of antenna elements 16 which, collectively, may be referred to as the "antenna farm" 12. The antenna elements 16 may be fabricated in any convenient form, such as by plating, deposition of conductive materials or forming degenerate semiconductor areas on the surface of the wafer. Control logic circuitry 17, as well as other circuit elements may also be included on the chip assembly 11.

Some implementations of the antenna farm 12 are more useful at higher frequencies, although the antenna farms 12 can be used with lower frequencies. To illustrate, GSM frequencies are typically in the 900 MHz and 1.9 GHz ranges. 3 G and UMTS frequencies are in the 1.9 GHz to 2.2 GHz range. PCS code division multiple access (CDMA) communications are transmitted at 1.9 GHz. Other bands go as high as 20 GHz, and consequently antenna elements packaged within an integrated circuit chip package are able to provide signal propagation functions for such communications. While an integrated circuit package is described, it is understood that the components may also be packaged in a small circuit module. It is also possible to provide a small circuit module which includes separately encapsulated integrated circuit chips within the small circuit module.

Figure 2:
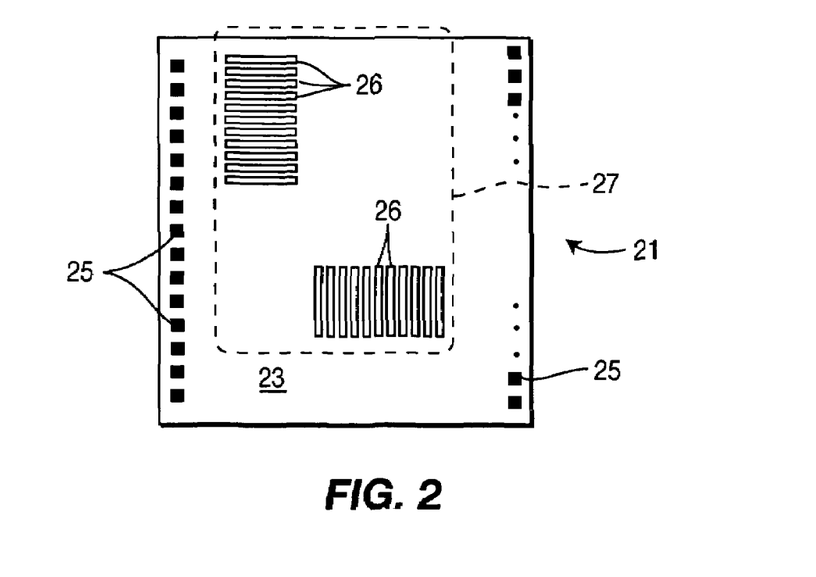
FIG. 2 is a diagrammatic representation of a semiconductor chip that includes an antenna pattern adjustment mechanism for adjusting the radiation pattern of the antenna farm of FIG. 1.

An alternate embodiment of the present invention includes the configuration of FIG. 1, but with a second semiconductor chip 21, depicted in FIG. 2. In the example shown, the second semiconductor chip 21 comprises a substrate having a front surface 23, a rear surface (not shown in FIG. 2) and a plurality of contacts 25 on the front surface. The substrate of the second semiconductor chip contains a respective plurality of switches 26 and/or relays that are arranged in a manner so as to overlay with a corresponding plurality of elements in the antenna farm. The plurality of switches and/or relays 26 are collectively referred to as a "switch farm" or "switch array" 27.

In one embodiment, the switches in the switch array generally correspond to antenna elements 16 in the antenna farm 12, so that the switches 26 are able to control respective antenna elements 16. One advantage of providing a separate switch array is that this enables fabrication of the switch elements without integrating them into the fabrication process for producing the integrated circuit chip 11 with the logic circuitry. This also facilitates producing the switch array in a manner which provides improved radio frequency (RF) isolation of the switching elements. In this manner, control of the switching can be effected with logic circuitry, while the actual switching can be effected with circuits which provide good RF switching characteristics. Antenna loading elements may be located on either chip, according to configuration. For example, while inductive loading elements are convenient to manufacture with other antenna elements 16, capacitive loading elements may be convenient to manufacture either as part of the antenna farm 12 or on the switch array 27.

In one embodiment to enhance cooling of the two chips 11, 21, the chip producing less heat is provided a heat sinking function for the other chip to enhance cooling.

Figure 3:
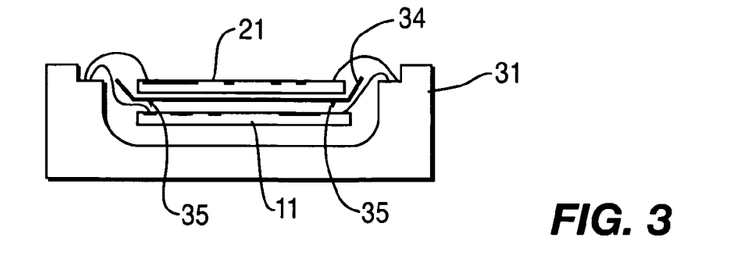
FIG. 3 is a diagrammatic representation of an arrangement in which multiple chips are juxtaposed in a face-to-back relationship in order to provide control of antenna elements.

FIG. 3 is a diagrammatic representation of an arrangement in which the first and second chips 11, 21 are positioned in a package 31 and are juxtaposed in a face-to-back relationship in order to provide control of antenna elements 16 (FIG. 1). In one embodiment, the package 31 is a semiconductor integrated chip carrier package, of the type used to permit a semiconductor integrated circuit chip to be enclosed and communicate with external circuits. Typically, electrical connections are effected between a chip housed within the package and terminations on the package. The terminations extend external to the housing of the package. Such connections between the chip and the package may be made by a number of techniques, such as by leadwires, ball bonding, and other techniques. Leadwires can be used when connected to different ICs integrated in the same package for multichip module or system in package (SIP) configurations.

The package such as package 31 containing one or more integrated circuit chips such as chips 11, 21 is a semiconductor integrated circuit device or IC. In the specific case of multiple chips packaged within a single package, the IC is a hybrid integrated circuit device or multichip module.

A web 34 is provided which includes a plurality of electrically conductive terminals. The web 34 is juxtaposed with the rear surface of the first semiconductor chip so that at least some of the conductive terminals will overlay the rear surface of the first semiconductor chip, and at least one of: (i) a contact on the first semiconductor chip, and (ii) a contact on the second semiconductor chip, is electrically connected to at least one of the conductive terminals. The web 34 includes conductive terminals or contacts 35 which mate with the contacts 15 on the front surface 13 of the first semiconductor chip 11. The contacts 35 on web 34 are thereby in ohmic contact with the contact pads 15 of the front 13 of the first semiconductor chip. By combining the two chips 22, 21 in the package 31, three layers of antenna, switch and switch control algorithms are provided.

While the chip 21 having the switch array 26 is depicted above the chip 11 having the logic circuitry, alternate arrangements for the relative positions of the two chips 11, 21 may be used. For example, chip 11 can be mounted over chip 21, so that chip 21 is nearest the bottom of the package 31.

Pursuant to a further embodiment, the radiation pattern of the antenna farm is adjusted by means of control logic. Such control logic, also referred to as "actuation logic", may be utilized to provide any of a plurality of different effective antenna configurations. Alternately, these configurations are adaptively selected using one or more adaptive algorithms. Such algorithms may be based upon one or more received signal parameters, providing a real-time response to physical movement and reorientation of the antenna. The switches 26 can also be used to control the radiation pattern of the antenna and to control the effective lengths frequency response characteristics, and active or parasitic characteristics of the antenna elements 16.

Pursuant to another embodiment, the actuation logic is integrated into the same substrate that includes the antenna farm. Alternatively, the actuation logic can be integrated into the substrate of the second semiconductor chip, distributed between them or on another element of the chip assembly.

Pursuant to additional embodiments, statistical switching of the antenna farm is provided to control the antenna radiation pattern. Such statistical switching can, but need not, be based upon carrier to interference for pilot signals, signal to noise ratio, transmit power, status of handover, or another type of structured algorithm. Actuation of the antenna farm may be linked with any element of the algorithm. For some applications, non-switched antenna operation may be employed, thereby providing a fixed radiation pattern. If the antenna farm is non-switched, certain elements of FIGS. 1 and 2 may, but need not, be eliminated. In cases where the antenna farm is switched, learning and cognitive algorithms may be implemented for improved control of the antenna radiation pattern.

The structured algorithm can, but need not, be based on a sampling of signals received by the antenna farm in whole or in part. The structured algorithm may be based on a sampling of a combination of signals received by the antenna farm and signals received from another antenna system. The antenna farm radiation pattern may be linked with an addressing/numbering scheme, and/or a serial addressing/numbering scheme.

Optionally, at least one of an isolative, conductive, dielectric, or ferrite like material may be employed to improve RF decoupling between the first semiconductor chip (including the antenna farm) and the second semiconductor chip (including the switch array). Pursuant to another optional feature, one or more switches of the switch array may provide a programmable or fixed delay for diversity processing. The switches could, but need not, be programmed to retain a delay value from one time period to another, based on an adaptive learning scenario. The speed at which switching takes place can be controlled to provide switching rates that are greater than, equal to, or less than the chip rate. For example, diodes based on tunneling-assisted impact ionization can switch in a picoseconds timeframe, thereby permitting switching at speeds well in excess of the chip level. The diode can be a switching diode. PIN diode, phase shifter, ferroelectric material or other device able to provide a switching or similar control function. The configuration, described above in connection with FIG. 2, facilitates the use of such switching because it avoids requirements to fit the switching elements within the constraints of fabrication of the chip having the logic circuitry.

In other embodiments, a separate chip for switching and a separate chip for the antenna farm are provided, in addition to the chip containing the logic. Such a configuration adds an additional chip level, but potentially allows the chips for the different functions to be more economically produced.

In other embodiments, a first portion of the antenna farm may be utilized to support communication via a first air interface, whereas another portion of the antenna farm may be utilized to support communication via a second air interface. Alternately, a first portion of the antenna farm may be used to support transmission on one frequency band, and a second portion of the antenna farm used to support transmission on another frequency band. The antenna farm can also be combined with other fixed or variable/smart antennas.

Preferably, the antenna farm chip produces a low amount of heat, but is provided with a substantial heat sinking and heat radiating capacity. The antenna farm may be utilized to provide a thermal radiation sink for heat-generating components.

Figure 4:
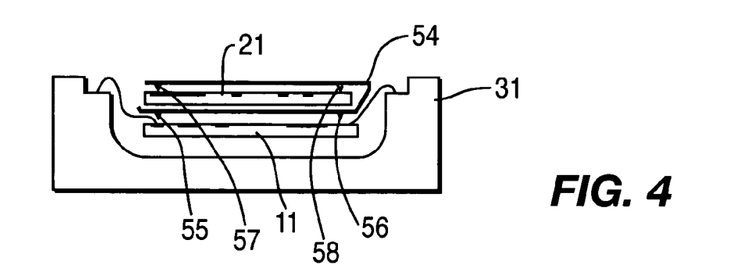
FIG. 4 is a diagrammatic representation of an alternate arrangement in which multiple chips are juxtaposed in a face-to-back relationship in order to provide control of antenna elements.

FIG. 4 is a diagrammatic representation of an alternate arrangement in which multiple chips are juxtaposed in a face-to-back relationship in order to provide control of antenna elements 16. The first and second chips 11, 21 are positioned in the package 31 and are juxtaposed in a face-to-back relationship. A web 54 is provided which includes a plurality of electrically conductive terminals 55–58. As is the case with web 34 in FIG. 3, web 54 is juxtaposed with the rear surface of the first semiconductor chip 21. Web 54 extends around to the front of the second semiconductor chip 21, which places the web 54 in a juxtaposed relationship with the face side 23 of the second semiconductor chip 21. Terminals 55 and 56 are on a side of the web 54 which faces the top side 13 of semiconductor chip 11, whereas terminals 57 and 58 are on an opposite side of the web 54. Terminals 57 and 58 are juxtaposed with the top side 23 of the second semiconductor chip 21. Accordingly, both chips 11, 21 are positioned in a face-up position. One particular advantage of this configuration is that it facilitates assembly with differently sized chips.

An interconnection substrate is provided which includes contact pads thereon. The conductive terminals of the web 54 are connected to the contact pads of the interconnection substrate. The interconnection substrate is adapted to connect the semiconductor chip assembly with other elements of a circuit, such that at least some of the conductive terminals will overlay the rear surface of the first semiconductor chip.

The configuration of FIG. 4 is also useful in cases in which a first one of the chips 11, 21 provides logic circuitry controlling switches on a second one of the chips 11, 21. The web 54 may have antenna elements formed thereon, as by plating. This permits the antenna elements to be placed within the package 31 on a layer separate from that of the logic circuitry and the switching array.

Figure 5:
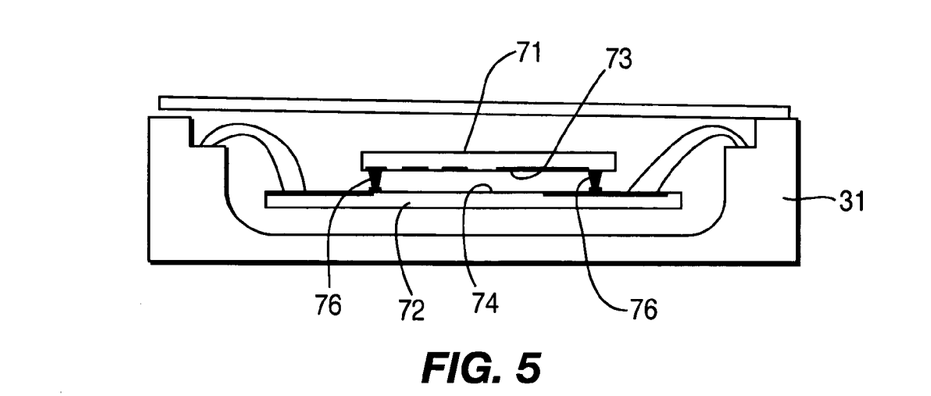
FIG. 5 is a diagrammatic representation of an arrangement in which multiple chips are juxtaposed in a facing relationship in order to provide control of antenna elements.

FIG. 5 is a diagram showing an arrangement in which a first semiconductor chip 71 is positioned above a second semiconductor chip 72, but the first semiconductor chip 71 is inverted so that the first and second chips 71, 72 face each other. The chips 71, 72 have faces 73, 74 which are therefore juxtaposed. In order to provide this arrangement, connections must be made either directly between bondpads, or between bondpads on the respective chips and an intermediate connector. Contacts 76 such as raised areas or ball bonds are used to connect circuitry between the top and bottom chips 71, 72. The top and bottom chips 71, 72 can be selected to be the chips containing the logic, switching array and logic according to design preference.

If an intermediate connector is used, the intermediate connector would be incorporated into the package 31 or leadframe. Alternately, the positions of the first and second semiconductor chips are switched.

The first and second semiconductor chips may be positioned so that the rear surface of the first semiconductor chip (with the antenna farm) is juxtaposed with the front surface of the second semiconductor chip (with the switch array). The plurality of switches and/or relays on the second semiconductor chip are arranged in a manner so that the corresponding plurality of elements in the antenna farm overlay the switches.

The lower chip may be positioned face down, so that the backsides of the chips are juxtaposed. This permits the lower chip to be bump bonded or otherwise attached to connection points. If connections between the chips are made through the package or leadframe, the lower chip can be bump bonded, attached in an inverted leadframe-over-chip, or similar inverted chip technique.

FIG. 5 is a diagram showing a pair of chips positioned so that the faces of the two chips are in a juxtaposed position. This has the advantage of permitting the switching array to be connected to the antenna elements. Further connections between circuit elements on one or both semiconductor substrates can be effected either directly from the chip to the package or by connections between the chips and then from one chip to the package.

Figure 6:
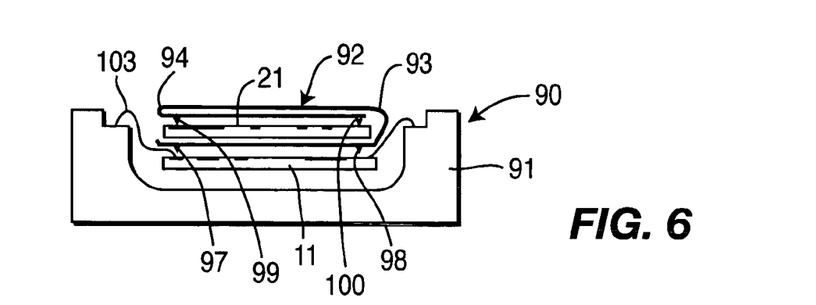
FIG. 6 is a diagrammatic representation of an alternate arrangement, in which multiple chips are positioned in a front-to-back relationship, and connected with a membrane.

FIG. 6 is a diagrammatic representation of a packaged semiconductor integrated circuit 90 according to an alternate arrangement, in which the first and second chips 11, 21 are positioned in a package 91 and are juxtaposed in a face-to-back relationship. In operation, the rear surface of the second semiconductor chip 21 is juxtaposed with the front surface of the first semiconductor chip 11. A flexible membrane 92 connects the first and second chips 11, 21. In assembling the packaged integrated circuit 90, the membrane 92 is folded back on itself, by forming bends 93, 94, so that one side of the membrane 92 bearing contacts 97–100 faces the top sides of the first and second chips 11, 21. The first and second chips 11, 21 are aligned with the membrane 92 and facing the contacts 97–100 of the membrane 91. The first and second chips 11, 21 are bonded to the membrane 92 so as to establish ohmic contact with the membrane 91 through the contacts 97–100, for example by ball bonding to the contacts 97–100. As a result of the membrane 92 being double folded both the first and second chips 11, 21 can be positioned face up, with the second chip 21 positioned over the first chip 11 inside the package 91. The chips 11, 21 may then be connected to the package 91, such as by wirebonds 103, through the membrane 91 or by other techniques.

This configuration of the folded membrane 92 provides ease of assembly in that a single side of the membrane 92 is used to establish connections for the chips 11, 21 by bonding the chips 11, 21 directly to the membrane 92.

The configuration of FIG. 6 can be used in cases in which a first one of the chips 11, 21 provide logic circuitry controlling switches on a second one of the chips 11, 21. The flexible membrane 92 may have antenna elements formed thereon, as by plating. This permits the antenna elements to be placed within the package 91 on a layer separate from that of the logic circuitry and the switching array.

Figure 7:
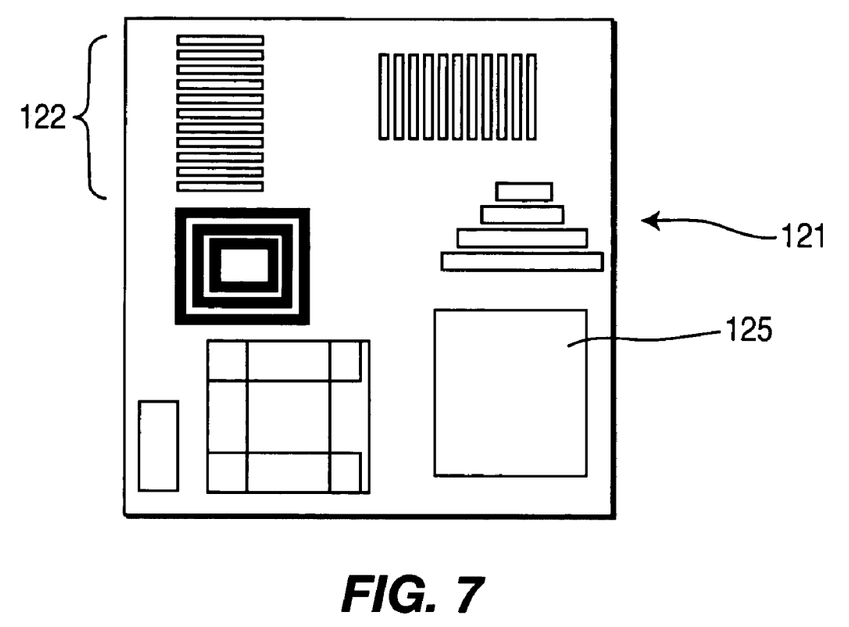
FIG. 7 is a diagrammatic representation of a semiconductor chip that includes a switching array and logic circuitry.
Figure 8:
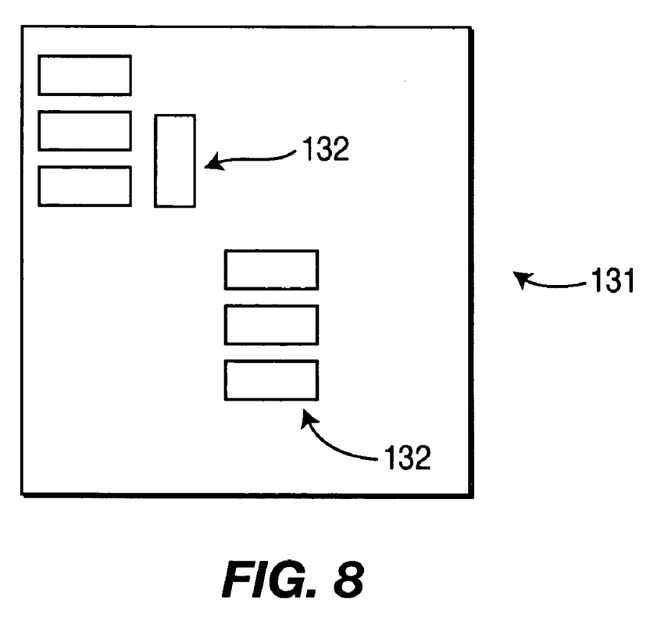
FIG. 8 is a diagrammatic representation of a semiconductor chip that includes an antenna farm controlled by the semiconductor chip of FIG. 7.

FIG. 7 is a diagrammatic representation of a semiconductor chip 121 that includes a switching array 122 and logic circuitry 125 in accordance with an alternate embodiment of the present invention. FIG. 8 is a diagrammatic representation of a semiconductor chip 131 that includes an antenna farm 132 controlled by the semiconductor chip 121 of FIG. 7. This is the reverse configuration of that depicted in FIGS. 1–2, but still involves the connection of the antenna farm 132 to switching array 122 by juxtaposing the two semiconductor chips 121, 131. This configuration has the advantage that the antenna farm 132 can be fabricated in a less complex manner than that required to fabricate semiconductor components with two or more conductive layers. In one configuration, the fabrication of the antenna farm 132 could be made with a metalliztion layer over an oxide layer, or even a resistive substrate. By forming the antenna array on a separate chip, it is possible to use scrap wafers for the antenna array. The use of scrap wafers makes it more economical to provide antenna arrays which occupy more silicon real estate than would be available on the logic chip.

Figure 9:
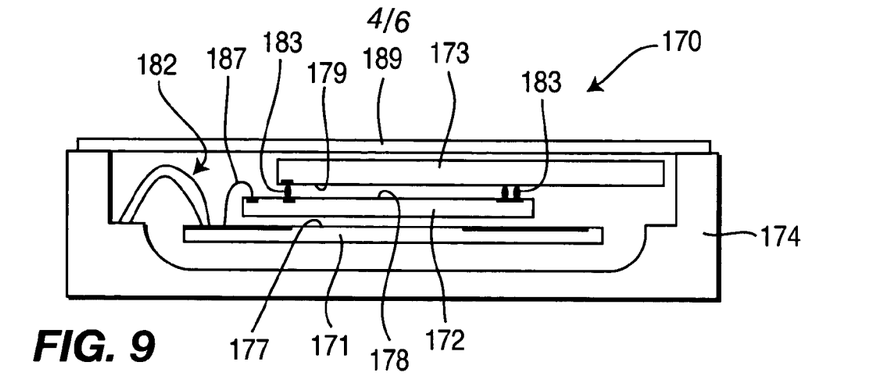
FIG. 9 is a cross-sectional view showing three separate semiconductor chips in a package.

FIG. 9 is a cross-sectional view of an assembly 170 in which three separate semiconductor chips 171–173 are mounted in a package 174. The semiconductor chips 171–173 are used for control logic 177 (on chip 171), switching array 178 (on chip 172) and an antenna farm 178 (on chip 173). This arrangement permits the use of different fabrication techniques for the different functions of the logic 177, antenna switching 178 and the antenna farm 179. The three layers of antenna, switch and algorithms are provided. Wirebond connections 182 are effected between one of the chips 171 and the package 174. Chips 172, 173 are connected with ball bonds 183, and a wirebond connection 187 is made between chip 172 and chip 171. It is understood that connections with chip 172 or 173 can be made directly through the package 174, and connections between the chips 171–173 can be effected by connection to package terminations. A lid 189 is provided which, if desired for purposes of signal propagation, may be made of a dielectric material. The specific selection of which of chips 171–173 are used for the control logic 177, the switching array 178 and the antenna farm 178 is one of design choice.

Figure 10:
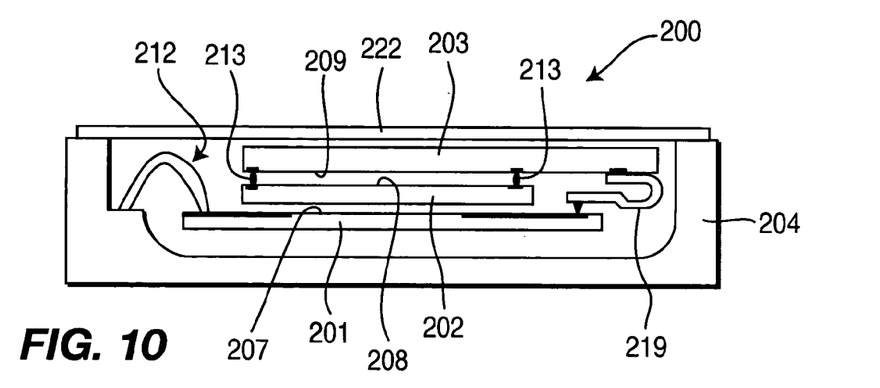
FIG. 10 is a cross-sectional view of a configuration of an assembly using three chips provided with an alternate connection arrangement.

FIG. 10 is a cross-sectional view of a configuration of an assembly 200 using an alternate connection arrangement. Separate semiconductor chips 201–203 are provided in a package 204. As is the case with the configuration of FIG. 9, semiconductor chips 201–203 are used for control logic 207 (on chip 201), switching array 208 (on chip 202) and an antenna farm 208 (on chip 203). Wirebond connections 212 are effected between one of the chips 201 and the package 204 and chips 202, 203 are connected with ball bonds 213. A flexible membrane web 219 is provided between chips 201 and 203, so that signals are communicated between chips 201 and 203 through the web. Connections between chip 201 and 202 is therefore through chip 203 and the web 219. As is the case with the arrangement of FIG. 9, connections with chip 202 or 203 can be made directly through the package 204, and connections between the chips 201–203 can be effected by connection to package terminations. A lid 222 is provided which, if desired for purposes of signal propagation, may be made of a dielectric material.

Figure 11:
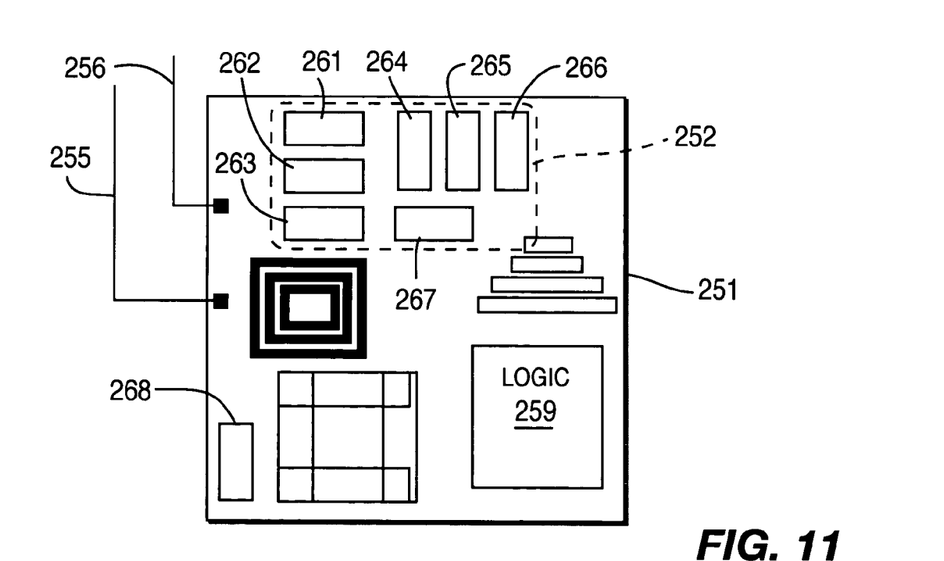
FIG. 11 is a diagrammatic representation of an arrangement in which a semiconductor chip includes an antenna farm connected to antenna elements external to the semiconductor chip.

FIG. 11 is a diagrammatic representation of an arrangement in which a semiconductor chip 251 includes an antenna farm 252 connected to antenna elements 255, 256 external to the semiconductor chip 251. Logic circuitry 259 may be included on the semiconductor chip 251. The antenna farm 252 consists of a plurality of antenna elements 261–268. The connection of the external elements 255, 256 to the elements 261–268 of the antenna farm 252 can be fixed to some or all of elements 261–268, or selectively switched. Switching of the internal elements on the antenna farm 252 and switching of the external elements 255, 256 can be achieved externally, such as by use of switch array 26, such as shown in FIG. 2.

By selectively connecting the antenna elements, it is possible to use a few fixed radiators in the form of the external elements 255, 256, while changing the characteristics of the antenna formed by the combination of the external elements 255, 256 and elements 261–268 of the antenna farm 252. Thus, for example, polarization of the antenna can be effected by selectively connecting the elements 261–268 of the antenna farm 252, in some cases without changing the physical orientation of the external elements 255, 256. This change in polarization is achieved by changing the orientation of the electromagnetic field of the antenna by selectively switching the elements 261–268 of the antenna farm 252.

Figure 12:
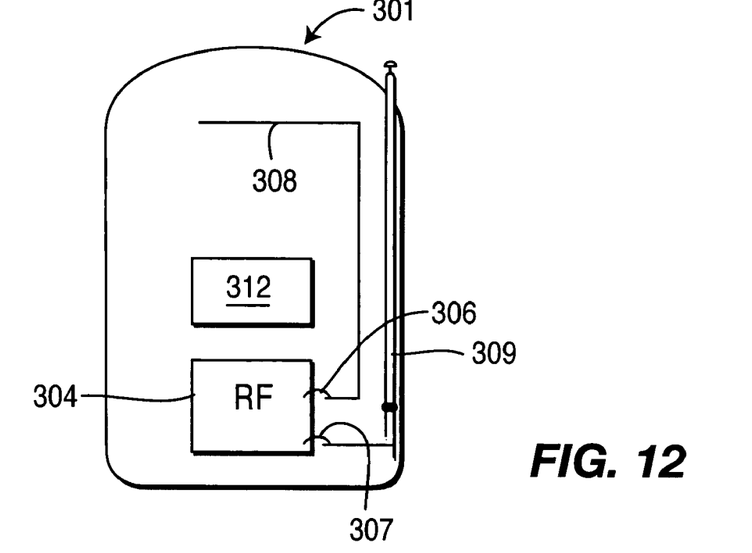
FIG. 12 is a diagram showing a wireless transmit/receive unit (WTRU) using the inventive antenna configuration.

FIG. 12 is a diagram showing a wireless transmit/receive unit (WTRU) 301 using an antenna farm. A wireless transmit/receive unit ("WTRU") includes but is not limited to a user equipment (UE), mobile station, fixed or mobile subscriber unit, pager, fixed portable or any other type of device capable of operating in a wireless environment. These exemplary types of wireless environments include, but are not limited to, wireless local area networks (WLANs) and public land mobile networks. A "base station" includes but is not limited to a base station, Node B, site controller, access point or other interfacing device in a wireless environment.

In FIG. 12, the WTRU 301 comprises an RF section semiconductor integrated circuit 304 which includes an antenna farm, and also includes external connections 306, 307 to antennas 308, 309. The external connections 306, 307 are normally internal to the WTRU 301 but external to the RF IC 304; however the WTRU 301 may also have an external antenna connection for connection of a remote antenna.

The RF IC 304 has further connections, such as to audio processing circuitry 312. By including an internal antenna farm such as described in connection with FIGS. 1–11, the WTRU's antenna pattern can be adjusted. The adjustment of the antenna pattern can be achieved despite the fact that externally connected antennas 308, 309 are in fixed positions with respect to the WTRU 301.

One area of growing interest for wireless communications is the use of a multiple input/multiple output (MIMO) arrangement. Typically, MIMO communications are conducted using a plurality of both transmitting and receiving antenna elements. One drawback to widespread application is having multiple antenna elements in small WTRU devices. The multiple IC embedded antenna elements as described can be used to facilitate such communication. The multiple antennal elements can be utilized for both transmission and reception, either alone or in conjunction with one or more external antenna elements.

Figure 13:
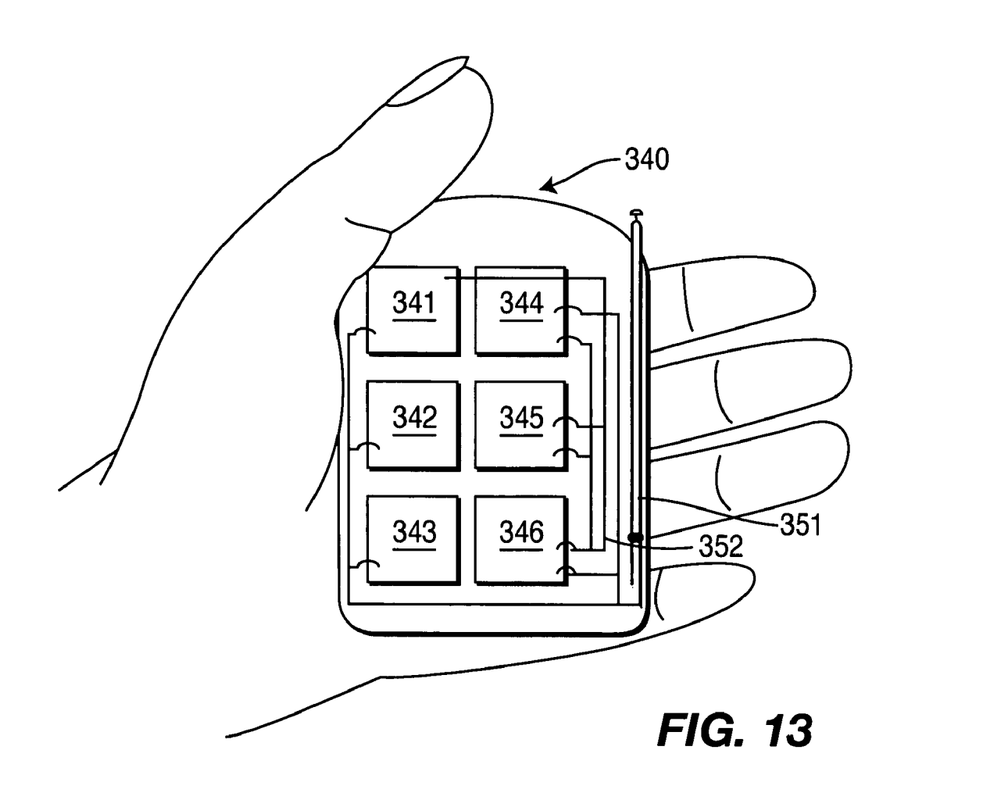
FIG. 13 is a diagram showing a configuration in which multiple ICs provide multiple input multiple output (MIMO) communications.

FIG. 13 is a diagram showing a configuration for a WTRU 340 in which multiple ICs 341–346 are provided to facilitate MIMO communications. These multiple ICs provide spatial diversity to facilitate MIMO communication. Alternately, an external antenna 351 can be used. The external antenna is coupled to the ICs 341–346 via connections 352. The use of the IC antenna elements facilitates spatial diversity in a small device, allowing for MIMO communication.

Figure 14:
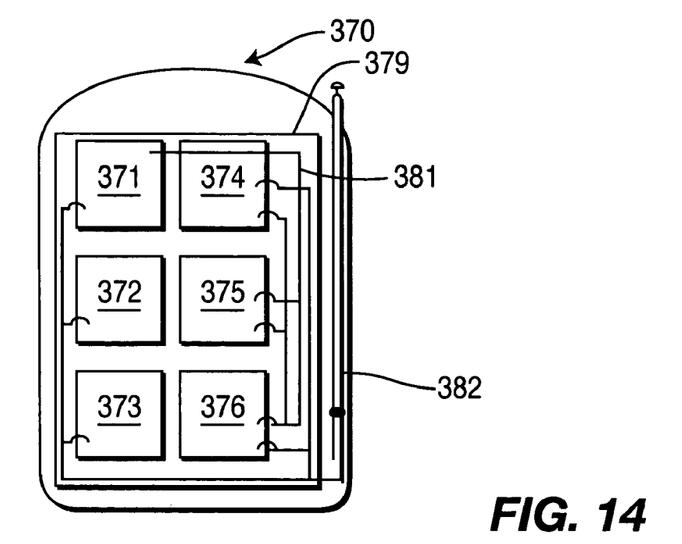
FIG. 14 is a diagram showing a configuration in which ICs are mounted on a printed circuit board having an antenna.

FIG. 14 is a diagram showing a configuration of a WTRU 370, in which multiple ICs 371–376 are mounted on a printed circuit board 379 having an antenna 381. The antenna 381 is printed onto the circuit board 379, so that the antenna is external to the ICs 371–376, but integral with the board 379. The WTRU also incorporates an antenna 382 which is separate from the board 379. The combination of the antenna arrays in one or more of the ICs 371–376 and the external antennas 381, 382 provide diversity of antenna functions between the ICs 371–376.

Figure 15:
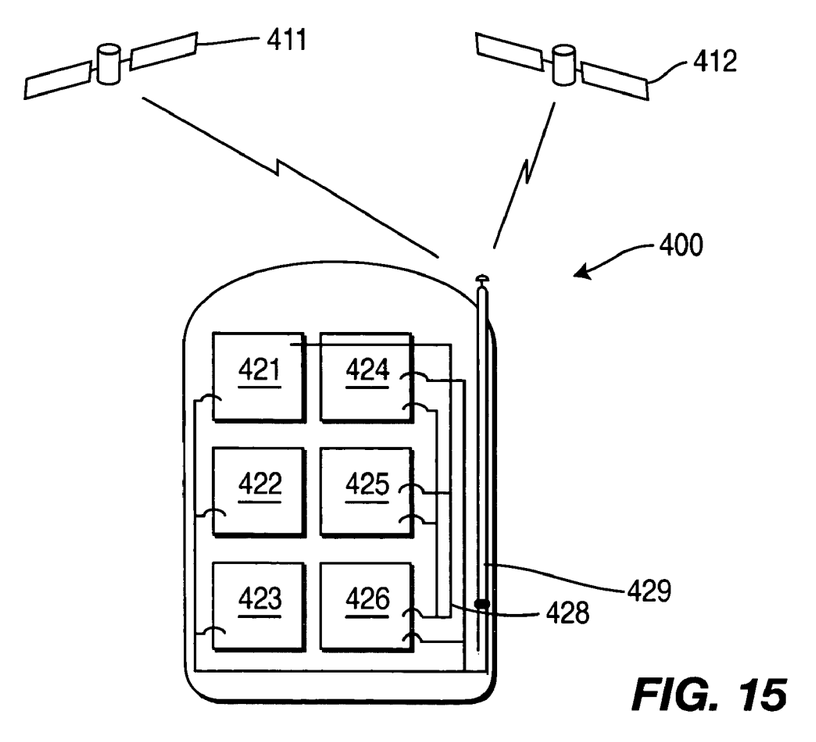
FIG. 15 is a diagram showing an exemplary use of the invention used in a variable input (VI) receiver.

FIG. 15 is a diagram showing an exemplary use of the invention used in a variable input (VI) receiver 400. In the case of a small receive-only device such as a satellite radio, digital video or digital audio systems, the multiple IC embedded antenna elements can be used to facilitate such communication. In the embodiment shown, VI arrangements permit the receiver 400 to track multiple signals, for example, those coming from different satellites 411, 412. Such variable input communications may be conducted using a plurality of receiving antenna elements, which may be integrated within one or more ICs 421 426. According to the present invention, when used in such a receive-only device 400, the multiple antenna elements can be utilized for reception. In addition to satellite broadcasts, the receiver 400 can receive signals from ground sources or from a combination of ground sources and satellites. As is the case with the WTRU configurations described, the multiple antenna units can be used either alone or in conjunction with one or more external antenna elements, such as antenna elements 428, 429.

What is claimed is:

1. A semiconductor integrated circuit (IC) providing antenna functions, the IC comprising:
   a first semiconductor integrated circuit chip comprising logic circuitry;
   a second semiconductor integrated circuit chip providing an antenna function;
   a connection between the first and second integrated circuit chips providing communication of circuitry on the first integrated circuit chip with the antenna function;
   an integrated circuit housing provided for the first and second integrated circuit chips and providing external connections for the first and second integrated circuit chips; and
   an antenna including a plurality of substantially conductive elements formed on one of the first and second integrated circuits, at least one of the conductive elements coupled to a radiation pattern adjustment mechanism, thereby permitting dynamic, real time adjustment of the antenna pattern in response to motion of the antenna, repositioning of the antenna, or other changing conditions,
   wherein the dynamic real time adjustment mechanism is controlled by control logic circuitry located on the first semiconductor chip.

2. The IC of claim 1 wherein the antenna function includes one of loading elements and active elements.

3. The IC of claim 2 wherein the antenna function includes a switching function for connecting at least one of the loading elements and the active elements.

4. The IC of claim 1 wherein other changing conditions includes handovers, transmit vs. receive mode for time duplex systems, or diversity processing methodology.

5. The IC of claim 4 further comprising connections for external antenna elements, the external antenna components functioning cooperatively with the antenna elements within the housing.

6. The IC of claim 1 wherein the radiation pattern adjustment mechanism is in form of a switch or relay.

7. The IC of claim 1 wherein the radiation pattern adjustment mechanism is in form of a switching diode.

8. The IC of claim 1 wherein the radiation pattern adjustment mechanism is in form of one of a switching diode PIN diode, phase shifter, ferroelectric material or other device able to provide a control function.

9. The IC of claim 1 wherein a first portion of the substantially conduct elements is utilized for communication via a first air interface, and a second portion of the substantially conductive elements may be utilized for communications via a second air interface.

10. The IC of claim 9 wherein the conductive elements located in the first portion and the conductive elements located in the second portion may be dynamically selected in response to motion of the antenna elements, repositioning of the antenna elements, quality of the signal on at least one of the first or second air interfaces, or other changing conditions.

11. A semiconductor integrated circuit (IC) providing antenna functions, the IC comprising:
    a first semiconductor integrated circuit chip comprising logic circuitry;
    a second semiconductor integrated circuit chip;
    a connection between the first and second integrated circuit chips;
    an antenna including a plurality of substantially conductive elements formed on one of the first and second integrated circuit chips, wherein the antenna includes at least one of the conductive elements coupled to a radiation pattern adjustment mechanism, thereby permitting dynamic, real time adjustment of the antenna pattern in response to motion of the antenna, repositioning of the antenna, or other changing conditions; and
    an integrated circuit housing provided for first and second integrated circuit chips and providing external connections for at least one of the first and second integrated circuit chips,
    wherein the dynamic real time adjustment of the antenna pattern is controlled by control logic circuitry located on the first semiconductor chip.

12. The IC of claim 11 wherein the connection between the first and second integrated circuit chips provides communication of circuitry on the first integrated circuit chip with a circuit providing an antenna function.

13. The IC of claim 11 wherein the radiation pattern adjustment mechanism is in form of a switch or relay.

14. The IC of claim 11 wherein the radiation pattern adjustment mechanism is in the form of a switching diode PIN diode, phase shifter, ferroelectric material or other device able to provide a control function.

15. The IC of claim 11 wherein the antenna includes a web member connected to at least one of the first and second integrated circuit chips and having thereon a plurality of substantially conductive elements formed thereon.

16. The IC of claim 11 wherein the antenna includes a web member connected to at least one of the first and second integrated circuit chips and having thereon a plurality of substantially conductive elements formed thereon, at least one of the conductive elements coupled to a radiation pattern adjustment mechanism, thereby permitting dynamic, real time adjustment of the antenna pattern in response to motion of the antenna, repositioning of the antenna, handovers, transmit vs. receive mode for time duplex systems, diversity processing methodology, or other changing conditions.

17. The IC of claim 16 wherein the web member includes a first set of contacts positioned for contacting contact pads on the first integrated circuit chip, and a second set of contacts positioned for contacting contact pads on the second integrated circuit chip, and connections extending between a plurality of the first set of contacts and ones of the second set of contacts.

18. The IC of claim 16 wherein the web member includes a first set of contacts on a contact side of the web member positioned for contacting contact pads on a top side of the first integrated circuit chip, and a second set of contacts on the contact side of the web member positioned for contacting contact pads on a top side of the second integrated circuit chip, and connections extending between a plurality of the first set of contacts and ones of the second set of contacts, the web folded such that the contact side juxtaposes top sides of the first and second integrated circuit chips with the first and second integrated circuit chips stacked in a top to bottom orientation with respect to one another.

19. The IC of claim 16 comprising the first and second integrated circuit chips aligned in a face to face alignment, thereby facilitating connection between the first and second integrated circuit chips through the web.

20. The IC of claim 11 comprising the first and second integrated circuit chips aligned in a face to face alignment, thereby facilitating connection between the first and second integrated circuit chips.

21. The IC of claim 11 comprising the at least one of the first and second integrated circuit chips including raised conductive areas for ball bond connections.

22. The IC of claim 11 further comprising connections for external antenna elements, the external antenna elements functioning cooperatively with the antenna elements within the housing.

23. A semiconductor integrated circuit (IC) providing antenna functions, the IC comprising:
a semiconductor integrated circuit chip comprising logic circuitry;
an antenna including a plurality of substantially conductive elements formed on a substrate providing antenna functions for the semiconductor integrated circuit chip, wherein at least one of the conductive elements is coupled to a radiation pattern adjustment mechanism, thereby permitting dynamic, real time adjustment of the antenna pattern in response to motion of the IC, repositioning of the IC, or other changing conditions; and
an integrated circuit housing provided for the integrated circuit chip and the antenna and providing external connections,
wherein the radiation pattern adjustment mechanism is controlled by control logic circuitry located on the first semiconductor chip.

24. The IC of claim 23 further comprising connections for external antenna elements, the external antenna components functioning cooperatively with the antenna elements within the housing.

25. The IC of claim 23 comprising said antenna formed on a web.

26. The IC of claim 23 comprising said antenna formed on said semiconductor integrated circuit chip comprising logic circuitry.

27. The IC of claim 23 comprising:
said antenna formed on said semiconductor integrated circuit chip comprising logic circuitry; and
a second integrated circuit chip, communicating with said antenna wherein the radiation pattern adjustment of said antenna is located on the second integrated circuit chip.

28. The IC of claim 23 comprising:
the semiconductor integrated circuit chip comprising the logic circuitry provided as a first integrated circuit chip;
a second integrated circuit chip;
a connection connecting the first and second integrated circuit chips; and
the connection between the first and second integrated circuit chips providing an antenna function.

29. The IC of claim 28 wherein:
the circuit on the second integrated circuit chip provides an antenna function and provides a radiation pattern adjustment mechanism;
the radiation pattern adjustment mechanism is provided in form of a switch; and
at least one of the conductive elements of the antenna has a coupling to the radiation pattern adjustment mechanism.

30. The IC of claim 28 further comprising connections for external antenna elements, the external antenna components functioning cooperatively with the antenna elements within the housing.

31. The IC of claim 28 comprising a web member having thereon a plurality of substantially conductive elements formed thereon, the web member connected to at least one of the first and second integrated circuit chips, the substantially conductive elements formed on the web forming at least part of the antenna.

32. The IC of claim 23 comprising:
the semiconductor integrated circuit chip comprising the logic circuitry provided as a first integrated circuit chip;
a second integrated circuit chip;
a connection connecting the first and second integrated circuit chips;
the second integrated circuit chip providing an antenna function, said antenna function including a radiation pattern adjustment mechanism, the radiation pattern adjustment mechanism provided in the form of a switching diode or relay; and
at least one of the conductive elements of the antenna has a coupling to the radiation pattern adjustment mechanism.

33. The IC of claim 23 comprising a web member connected to at least one semiconductor integrated chip within the housing and having thereon a plurality of substantially conductive elements formed thereon, the substantially conductive elements formed on the web member forming at least part of the antenna, at least one of the conductive elements coupled to a radiation pattern adjustment mechanism, thereby permitting dynamic, real time adjustment of the antenna pattern in response to handovers, transmit vs. receive mode for time duplex systems, diversity processing methodology, or other changing conditions.

34. The IC of claim 23 comprising at least one of the conductive elements of the antenna having a coupling to a radiation pattern adjustment mechanism in the form of a switching diode or relay.

35. The IC of claim 23 comprising the antenna including a plurality of substantially conductive elements formed on one of the first and second integrated circuits, at least one of the conductive elements coupled to a radiation pattern adjustment mechanism in the form of a switch or relay.

36. The IC of claim 23 wherein the radiation pattern adjustment mechanism is in the form of one of a switching diode PIN diode, phase shifter, ferroelectric material or other device able to provide a control function.

37. The IC of claim 23 comprising at least a plurality of the antenna elements arranged in a manner so as to provide parasitic interaction.

38. A semiconductor integrated circuit (IC) comprising:
a first layer providing logic circuitry functions;
a second layer including antenna switching circuitry, the second layer operatively connected to the first layer and the antenna switching circuitry responsive to the logic circuitry functions to effect antenna switching;
a third layer including antenna elements switched by the antenna switching circuitry, wherein said antenna switching circuitry provides a radiation pattern adjustment mechanism, thereby permitting dynamic, real time adjustment of the antenna pattern in response to motion of the antenna, repositioning of the antenna, or other changing conditions,
wherein the radiation pattern adjustment mechanism is controlled by control logic circuitry located on the first layer.

39. The IC of claim 38, wherein:
a first semiconductor chip includes the first layer;
a second semiconductor chip includes at least one of the second and third layers; and
the first and second semiconductor chips housed in a common integrated circuit chip carrier housing.

40. The IC of claim 39 comprising the third layer includes a plurality of substantially conductive antenna elements formed on one of the first and second semiconductor chips.

41. The IC of claim 38 comprising a web member having thereon a plurality of substantially conductive antenna elements formed thereon, the web member comprising the third layer.

42. The IC of claim 38, wherein:
a first semiconductor chip includes the first layer;
a second semiconductor chip includes the second layer;
the third layer carried on a substrate separate from the first and second layers; and
the first and second semiconductor chips and the substrate housed in a common integrated circuit chip carrier housing and arranged in a substantially stacked relationship so that a least a portion of each of the first and second semiconductor chips and the substrate overlap at least a portion of at least one other one of the first and second semiconductor chips and the substrate.

43. The IC of claim 38 further comprising connections for external antenna elements, the external antenna components functioning cooperatively with the antenna elements on the third layer.

44. The IC of claim 38 comprising said antenna elements formed on a web, the web comprising the third layer.

45. The IC of claim 38 comprising the switching circuitry provided in the form of a switching diode or relay.

46. The IC of claim 38 comprising at least a plurality of the antenna elements arranged in a manner so as to provide parasitic interaction.

47. A semiconductor circuit assembly, comprising:
a first semiconductor chip including a substrate having a front surface, a rear surface and a plurality of contacts on said front surface; wherein the substrate includes a plurality of antenna elements;
a second semiconductor chip including a substrate having a front surface, a rear surface and a plurality of contacts on said front surface; wherein said rear surface of said second semiconductor chip is configured for juxtaposition with said front surface of said first semiconductor chip; wherein the substrate of the second semiconductor chip contains a respective plurality of switching components, configured in an alignment with a corresponding plurality of elements in the antenna farm;
a connection arrangement including a plurality of electrically conductive terminals configured for providing ohmic contact between the first and second semiconductor chips; and
interconnection to connect the switching elements with the antenna elements; and
a radiation pattern adjustment mechanism, permitting dynamic, real time adjustment of the antenna pattern in response to motion of the antenna, repositioning of the antenna, or other changing conditions,
wherein the radiation pattern adjustment mechanism is controlled by control logic circuitry located on the first semiconductor.

48. The semiconductor circuit assembly of claim 47, wherein the plurality of switching elements contains at least one of (i) a respective plurality of switches, and (ii) a respective plurality of relays.

49. The semiconductor circuit assembly of claim 47, wherein the plurality of switching elements overlay a corresponding plurality of elements in the antenna farm.

50. The semiconductor circuit assembly of claim 47, wherein the connection arrangement includes:
a backing element having a plurality of electrically conductive terminals, said backing element being configured for juxtaposition with said rear surface of said first semiconductor chip such that at least one of said conductive terminals overlay said rear surface of said first semiconductor chip, at least one of: (i) one or more contacts on said first semiconductor chip, and (ii) one or more contacts on said second semiconductor chip; are electrically connected to at least one of the conductive terminals; and
an interconnection substrate having contact pads thereon, said conductive terminals being connected to said contact pads, said interconnection substrate being adapted to connect the semiconductor chip assembly with other elements of a circuit.

51. A wireless transmit/receive unit (WTRU) configured for facilitating multiple input/multiple output (MIMO) communications, the WTRU comprising:
a semiconductor integrated circuit chip comprising an antenna farm for use in receiving and transmitting MIMO communications, the antenna farm having a plurality of antenna elements providing spatial diversity; and
a radiation pattern adjustment mechanism, permitting dynamic, real time adjustment of the antenna pattern in response to motion of the antenna, repositioning of the antenna, or other changing conditions, wherein the radiation pattern adjustment mechanism is controlled by control logic circuitry located on the semiconductor integrated circuit chip.

52. The WTRU of claim 51 further comprising a plurality of the semiconductor integrated circuit chips.

53. The WTRU of claim 51 further comprising an external antenna element coupled to the semiconductor integrated circuit chip.

54. The WTRU of claim 51 further comprising:
a first semiconductor integrated circuit chip comprising logic circuitry;
a second semiconductor integrated circuit chip providing at least one antenna function, the semiconductor integrated circuit chip comprising the antenna farm formed as one of the first and second integrated circuit chips;
a connection between the first and second integrated circuit chips providing communication of circuitry on the first integrated circuit chip with the antenna function; and
an integrated circuit housing provided for the first and second integrated circuit chips and providing external connections for the first and second integrated circuit chips.

55. The WTRU of claim 51 further comprising:
a printed circuit board, the semiconductor integrated circuit chip comprising the antenna farm mounted to the printed circuit board;
the printed circuit board including at least one further antenna element;
an integrated circuit package mounted to the printed circuit board; and
a connection between the semiconductor integrated circuit chip and the further antenna element, thereby providing additional spatial diversity.

56. A method of providing an antenna function for a small electronic device, the method comprising:
providing an antenna within a package of an integrated circuit, wherein the antenna includes a radiation pattern adjustment mechanism, permitting dynamic, real time adjustment of the antenna pattern in response to motion of the antenna, repositioning of the antenna, or other changing conditions, the radiation pattern adjustment mechanism being controlled control logic circuitry located on the integrated circuit;
using the integrated circuit to process signals communicated through the antenna by using RF circuitry within the integrated circuit; and
using the integrated circuit to control connection of the antenna within the integrated circuit to the RF circuitry within the integrated circuit.

57. The method of claim 56, comprising:
providing a further antenna element on a printed circuit board;
mounting the integrated circuit package to the printed circuit board; and
using the integrated circuit to control connection of the further antenna element to the RF circuitry within the integrated circuit.

58. A method for assembling an integrated circuit configured for radio frequency communications, the method comprising:
providing a first semiconductor integrated chip, the first semiconductor integrated circuit chip including logic circuitry for providing a control function for said radio frequency communications;
providing a layer including antenna elements;
providing a connection between the first integrated chip with the antenna elements, and connecting the first integrated circuit chip to a semiconductor integrated package;
providing a radiation pattern adjustment mechanism, permitting dynamic, real time adjustment of the antenna pattern in response to motion of the antenna, repositioning of the antenna, or other changing conditions, wherein the radiation pattern adjustment mechanism is controlled by control logic circuitry located on the first semiconductor integrated chip; and
encapsulating the first integrated circuit chip and the layer including the antenna elements in a semiconductor package.

59. The method of claim 58, comprising providing a switching layer including antenna switching circuitry, the switching layer operatively connected to the first integrated circuit chip and the antenna, the switching circuitry responsive to logic circuitry functions of the logic circuitry on the first integrated circuit chip to effect antenna switching.

60. A wireless transmit/receive unit (WTRU) comprising:
a first semiconductor integrated circuit chip comprising logic circuitry;
a second semiconductor integrated circuit chip providing an antenna function;
a connection between the first and second integrated circuit chips providing communication of circuitry on the first integrated circuit chip with the antenna function;
a radiation pattern adjustment mechanism, permitting dynamic, real time adjustment of the antenna pattern in response to motion of the antenna, repositioning of the antenna, or other changing conditions, wherein the radiation pattern adjustment mechanism is controlled by control logic circuitry located on the first semiconductor integrated circuit chip; and
an integrated circuit housing provided for the first and second integrated circuit chips and providing external connections for the first and second integrated circuit chips.

61. A receive unit (RU) configured for facilitating variable input (VI) communications, the RU comprising:
a semiconductor integrated circuit chip comprising an antenna farm for use in receiving VI communications, the antenna farm having a plurality of antenna elements for receiving spatially diverse signals of the VI communications and a radiation pattern adjustment mechanism, permitting dynamic, real time adjustment of the antenna pattern in response to motion of the antenna, repositioning of the antenna, or other changing conditions, wherein the radiation pattern adjustment mechanism is controlled by control logic circuitry located on the semiconductor integrated circuit chip.

62. The RU of claim 61 further comprising a plurality of the semiconductor integrated circuit chips.

63. The RU of claim 61 further comprising an external antenna element coupled to the semiconductor integrated circuit chip.

64. The RU of claim 61 further comprising:
a first semiconductor integrated circuit chip comprising logic circuitry;
a second semiconductor integrated circuit chip providing at least one antenna function, the semiconductor integrated circuit chip comprising the antenna farm formed as one of the first and second integrated circuit chips;

a connection between the first and second integrated circuit chips providing communication of circuitry on the first integrated circuit chip with the antenna function; and an integrated circuit housing provided for the first and second integrated circuit chips and providing external connections for the first and second integrated circuit chips.

65. A radio frequency (RF) communication circuit comprising:

a printed circuit board;

an integrated circuit housing mounted to the printed circuit board and providing electrical connections for connecting circuitry within the housing to the printed circuit board and including therein at first layer providing logic circuitry functions, antenna switching circuitry, the switching circuitry responsive to the logic circuitry functions to effect antenna switching, and a second layer including antenna elements switched by the antenna switching circuitry;

a radiation pattern adjustment mechanism, permitting dynamic, real time adjustment of the antenna pattern in response to motion of the antenna elements, repositioning of the antenna elements, or other changing conditions, wherein the radiation pattern adjustment mechanism is controlled by control logic circuitry located on the first layer;

the printed circuit board including at least one further antenna element; and a connection between the semiconductor integrated circuit chip and the further antenna element.

66. The RF communications circuit of claim 65, comprising circuitry for providing multiple input/multiple output (MIMO) communications, the switched antenna elements providing spatial diversity; and the further antenna element providing additional spatial diversity for the MIMO communications.

* * * * *

UNITED STATES PATENT AND TRADEMARK OFFICE
CERTIFICATE OF CORRECTION

PATENT NO. : 7,163,155 B2
APPLICATION NO. : 10/744799
DATED : January 16, 2007
INVENTOR(S) : Briancon et al.

It is certified that error appears in the above-identified patent and that said Letters Patent is hereby corrected as shown below:

At column 5, line 16, after the words "switching diode", delete "." and insert therefor --,--.

At column 9, line 4, after the word "multiple", delete "antennal" and insert therefor --antenna--.

At column 9, line 35, before the word "According" delete "421 426" and insert therefor --421, 426--.

At claim 8, column 10, line 21, after the word "diode", insert --,--.

At claim 9, column 10, line 25, after the word "substantially", delete "conduct" and insert therefor --conductive--.

At claim 14, column 10, line 67, after the words "mechanism is in", delete "the form of a switching diode" and insert therefor --form of a switching diode,--.

At claim 32, column 12, line 56, before the word "form", delete "the".

At claim 34, column 13, line 7, before the word "form", delete "the".

At claim 35, column 13, line 13, before the word "form", delete "the".

At claim 36, column 13, line 15, before the word "form", delete "the".

At claim 36, column 13, line 16, after the first use of the word "diode", insert --,--.

At claim 42, column 13, line 58, before the word "least", delete "a" and insert therefor --at--.

At claim 45, column 14, line 2, before the word "form", delete "the".

UNITED STATES PATENT AND TRADEMARK OFFICE
CERTIFICATE OF CORRECTION

PATENT NO.       : 7,163,155 B2
APPLICATION NO.  : 10/744799
DATED            : January 16, 2007
INVENTOR(S)      : Briancon et al.

It is certified that error appears in the above-identified patent and that said Letters Patent is hereby corrected as shown below:

At claim 56, column 15, line 45, before the word "control", insert --by--.

Signed and Sealed this

Seventh Day of August, 2007

JON W. DUDAS
*Director of the United States Patent and Trademark Office*